(12) United States Patent
Yamadera et al.

(10) Patent No.: US 11,791,796 B2
(45) Date of Patent: Oct. 17, 2023

(54) BONDED BODY OF PIEZOELECTRIC MATERIAL SUBSTRATE AND SUPPORTING SUBSTRATE

(71) Applicant: NGK INSULATORS, LTD., Nagoya (JP)

(72) Inventors: Takahiro Yamadera, Nagoya (JP); Saki Nakayama, Fujiyoshida (JP); Yuji Hori, Owariasahi (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 17/356,864

(22) Filed: Jun. 24, 2021

(65) Prior Publication Data

US 2021/0328570 A1    Oct. 21, 2021
US 2022/0158609 A9    May 19, 2022

Related U.S. Application Data

(63) Continuation of application No. PCT/JP2020/042102, filed on Nov. 11, 2020.

(30) Foreign Application Priority Data

Nov. 29, 2019    (JP) ................. 2019-216528

(51) Int. Cl.
     *H03H 9/02*    (2006.01)
     *H03H 9/25*    (2006.01)

(52) U.S. Cl.
     CPC .... *H03H 9/02574* (2013.01); *H03H 9/02559* (2013.01); *H03H 9/25* (2013.01)

(58) Field of Classification Search
     CPC ........................ H03H 9/02559; H03H 9/02574

(Continued)

(56) References Cited

U.S. PATENT DOCUMENTS 6,445,265 B1    9/2002    Wright
2006/0281201 A1    12/2006    Hachigo et al.

(Continued)

FOREIGN PATENT DOCUMENTS

EP    3490144 A1    5/2019
EP    3490146 A1    5/2019

(Continued)

OTHER PUBLICATIONS

International Search Report with English Translation issued in corresponding International Application No. PCT/JP2020/042102 dated Dec. 22, 2020 (5 pages).

(Continued)

*Primary Examiner* — Derek J Rosenau
(74) *Attorney, Agent, or Firm* — FLYNN THIEL, P.C.

(57) ABSTRACT

A bonded body includes a supporting substrate; a piezoelectric material substrate composed of a material selected from the group consisting of lithium niobate, lithium tantalate and lithium niobate-lithium tantalate; and a bonding layer bonding the supporting substrate and piezoelectric material substrate and contacting a main surface of the piezoelectric material substrate. At least one of a bonding surface of the supporting substrate and a bonding surface of the piezoelectric material substrate, as measured by spectral ellipsometry with Δ being assigned to a difference of phases of p-polarized light and s-polarized light of a reflected light, has a difference of the maximum and minimum values of the difference Δ of the phases in a wavelength range of 400 nm to 760 nm of 70° or lower.

16 Claims, 9 Drawing Sheets

(58) Field of Classification Search
USPC ...... 310/313 R, 313 A, 313 B, 313 C, 313 D
See application file for complete search history.

(56) References Cited

U.S. PATENT DOCUMENTS

| 2012/0194032 | A1* | 8/2012 | Kadota | ............... | H03H 9/02559 |
|---|---|---|---|---|---|
| | | | | | 310/313 A |
| 2017/0063333 | A1 | 3/2017 | Gilbert et al. | | |
| 2019/0036009 | A1 | 1/2019 | Tai et al. | | |
| 2019/0288661 | A1 | 9/2019 | Akiyama et al. | | |
| 2021/0006224 | A1 | 1/2021 | Hori et al. | | |

FOREIGN PATENT DOCUMENTS

| JP | 8148957 | A | 6/1996 |
|---|---|---|---|
| JP | 2005308612 | A | 11/2005 |
| JP | 201486400 | A | 5/2014 |
| JP | 2016217752 | A | 12/2016 |
| JP | 6250856 | B1 | 12/2017 |
| WO | 2017092378 | A1 | 6/2017 |
| WO | 2017163722 | A1 | 9/2017 |
| WO | 2019181087 | A1 | 9/2019 |

OTHER PUBLICATIONS

Written Opinion of International Searching Authority issued in corresponding International Application No. PCT/JP2020/042102 dated Dec. 22, 2020 (3 pages).
English Translation of the International Preliminary Report on Patentability, issued in corresponding International Application No. PCT/JP2020/042102, dated Jun. 9, 2022 (5 pages).
Extended European Search Report issued in corresponding European Application No. 20892238.5, dated Apr. 24, 2023 (7 pages).
Taiwan Office Action issued in corresponding Taiwan Application No. 109141755 dated Jul. 2023 (6 pages).

* cited by examiner

BONDED BODY OF PIEZOELECTRIC MATERIAL SUBSTRATE AND SUPPORTING SUBSTRATE

CROSS-REFERENCE TO RELATED APPLICATIONS

This is a continuation of PCT/JP2020/042102, filed Nov. 11, 2020, which claims priority to Japanese Application No. 2019-216528 filed on Nov. 29, 2019, the entire contents of which are hereby incorporated by reference.

TECHNICAL FIELD

The present invention relates to a bonded body of a piezoelectric material substrate and supporting substrate and an acoustic wave device.

BACKGROUND ARTS

It is known that, according to a surface acoustic wave filter obtained by adhering lithium tantalate and sapphire through a silicon oxide layer, a bulk wave is generated at the bonding interface so that an unnecessary response is generated in the transmission band and the high frequency band. For preventing this, it has been proposed that a roughened surface be introduced at the bonding interface to scatter the bulk wave and to suppress the unnecessary response (Patent documents 1 and 2).

According to patent document 1, when the bonding surface is roughened, as to the geometrical specification of the roughened surface, the ratio of an average length RSm in a cross sectional profile of a convex-concave structure forming the roughened surface and a wavelength A of a surface acoustic wave is 0.2 or larger and 7.0 or smaller, and the arithmetic average roughness Ra of the cross sectional profile of the convex-concave structure is 100 nm or larger. Further, a difference in height of a roughened surface is disclosed in patent document 2.
(Patent document 1) Japanese Patent No. 6250856B
(Patent document 2) U.S. Patent Publication No. 2017-063333A1

SUMMARY OF THE INVENTION

In the prior art, the convex-concave morphology (for example, RSm or Ra) of a bonding surface of a supporting substrate or piezoelectric material substrate was measured, and the values were adjusted to be slightly large for suppressing the spurious wave. However, even in the case when RSms of the bonding surfaces are the same, there may be cases where the spurious wave could not be suppressed. Thus, the spurious wave cannot be suppressed by simply adjusting the convex-concave morphology of the bonding surface.

An object of the present invention is to provide a novel structure for suppressing the spurious wave, which cannot be suppressed by adjusting the surface morphology of a bonding surface of a piezoelectric material substrate or supporting substrate of a bonded body.

The present invention provides a bonded body comprising:
a supporting substrate;
a piezoelectric material substrate comprising a material selected from the group consisting of lithium niobate, lithium tantalate and lithium niobate-lithium tantalate; and
a bonding layer bonding said supporting substrate and said piezoelectric material substrate,
provided that at least one of a bonding surface of said supporting substrate and a bonding surface of said piezoelectric material substrate is measured by spectral ellipsometry and that $\Delta$ is assigned to a difference of phases of p-polarized light and s-polarized light of a reflected light, a difference of the maximum and minimum values of said difference $\Delta$ of said phases in a wavelength range of 400 nm to 760 nm is 70° or smaller.

The inventors made the bonding surface of the supporting substrate or piezoelectric material substrate a mirror surface and then formed a roughened surface by mechanical processing, and the microstructure was observed and analyzed in detail. As a result, it has been found that minute defects or denaturing of the film, which cannot be evaluated based on the surface convex-concave morphology, are generated on the bonding surface after the mechanical processing. Based on such measurement results, it was found that the effect of suppressing the spurious wave needs to be controlled based not on the surface convex-concave morphology but based on the effective crystallographic and geometric characteristics in surface regions of the piezoelectric material substrate and bonding layer.

Based on such findings, the present inventors researched various kinds of processing and measuring methods of the bonding surface. During the research, the inventors noticed spectral ellipsometry.

That is, spectral ellipsometry is an analyzing method of measuring change of the polarized state of an incident light onto, and that of the reflected light from, a surface of a sample (piezoelectric material substrate or supporting substrate). Specifically, for example as shown in FIG. 1, the incident plane is defined as a plane which is perpendicular to the surface of the substrate and includes the incident light and reflected light. The p-polarized light is defined as a polarized component whose electric field vibrates in parallel with the incident plane, and the s-polarized light is defined as a component whose electric field vibrates perpendicular to the incident plane. Here, the incident light is defined as a linearly polarized light in which the amplitudes and phases of the p-polarized light and s-polarized light are matched with each other. As the incident light is irradiated onto the substrate, the light reflected at the substrate surface and the light reflected at interfaces of layers or defects near the substrate surface interfere with each other. Further, as the velocity of the light propagating in the substrate is lower in response to the refractive index of the corresponding part, the phase is shifted at the same time. As these are different in the component (p-polarized light) in parallel with the incident plane and in the component (s-polarized light) perpendicular to the incident plane, as shown in FIG. 1, the polarized state of the reflected light becomes elliptical polarized light, which is different from that of the incident light.

Thus, the measurement results by spectral ellipsometry carry information of convex-concave morphology on the thin film on the substrate surface as well as information in the depth direction of the thin film (film thickness and density).

The inventors tried to apply spectral ellipsometry to the bonding surface after the roughening process of the piezoelectric material substrate or supporting substrate, for obtaining information of denaturing or change of density of a region near the bonding surface, and to research the relationship between the information and the effect of suppressing the spurious wave.

The bonding surface of the piezoelectric material substrate or supporting substrate is subjected to a roughening process. Thereafter, the present inventors performed the measurement by the spectral ellipsometry of the bonding surfaces of the piezoelectric material substrate and supporting substrate after various kinds of roughening processes, so that the various kinds of polarized states of the reflected light are measured. As a result, particularly in the visual light range (range between a wavelength of 400 nm and 760 nm), provided that Δ is assigned to the difference of the phases of the p-polarized light and s-polarized light of the reflected light, it was found that the effect of suppressing the spurious wave can be considerably improved by making the difference of the maximum and minimum values of the difference Δ of the phases 70° or lower. The present invention is thus made.

MODES FOR CARRYING OUT THE INVENTION

Figure 1:
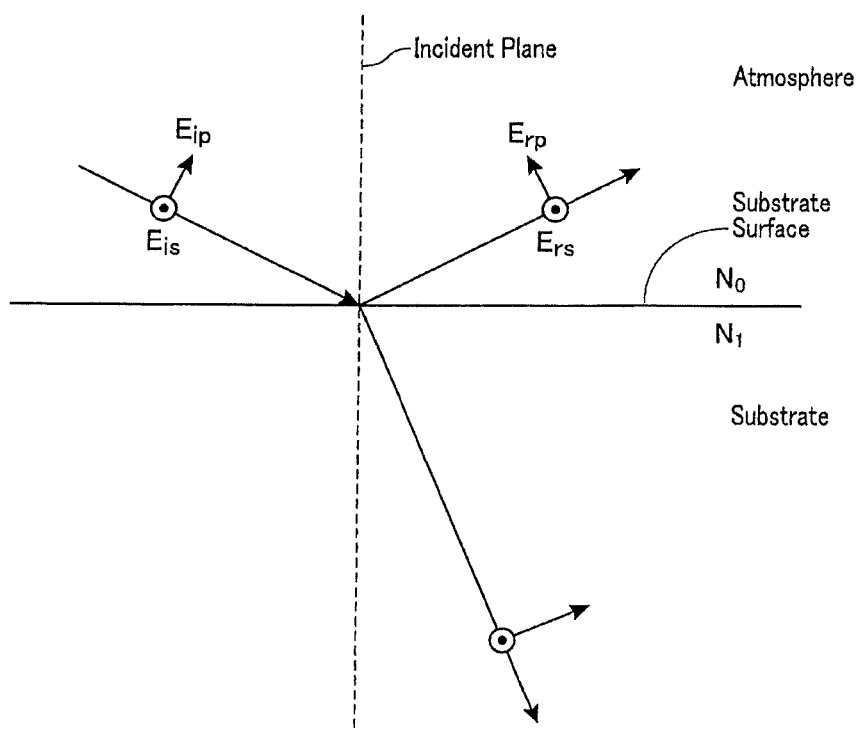
FIG. 1 is a conceptual diagram for illustrating the principle of spectral ellipsometry.

Embodiments of the present invention will be described in detail below, appropriately referring to the drawings.

First, a bonded body and an acoustic wave device including the same are described.

Figure 2A:
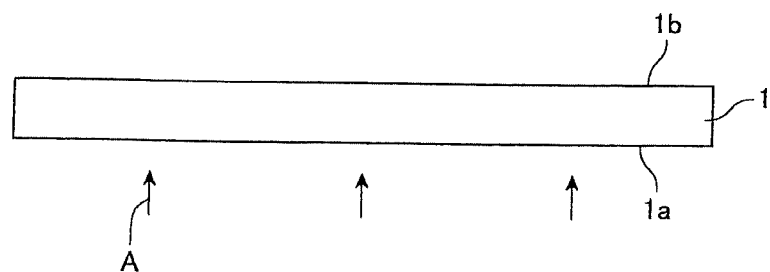
FIG. 2(a) shows the state that a bonding surface of a supporting substrate is processed.
Figure 2B:
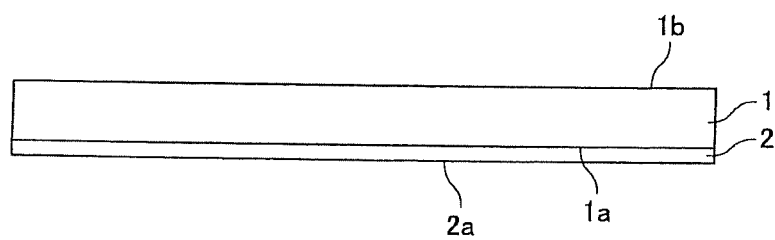
FIG. 2(b) shows the state that a bonding layer is provided on the bonding surface of the supporting substrate.
Figure 2C:
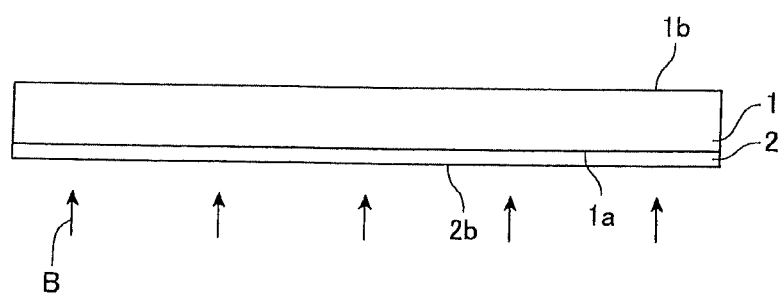
FIG. 2(c) shows the state that plasma is irradiated onto a bonding surface of the bonding layer to activate the surface.

As shown in FIG. 2(a), a supporting substrate 1 has a pair of main surfaces 1a and 1b. Processing A is then performed on the main surface (bonding surface) 1a to roughen the surface. Then, as shown in FIG. 2(b), a bonding layer 2 is film-formed on the main surface 1a of the supporting substrate 1. The surface 2a of the bonding layer 2 is subjected to CMP polishing to obtain a mirror surface. Then, as shown in FIG. 2(c), plasma B is irradiated onto the surface 2a of the bonding layer 2 to obtain a surface-activated bonding surface 2b.

Figure 3A:
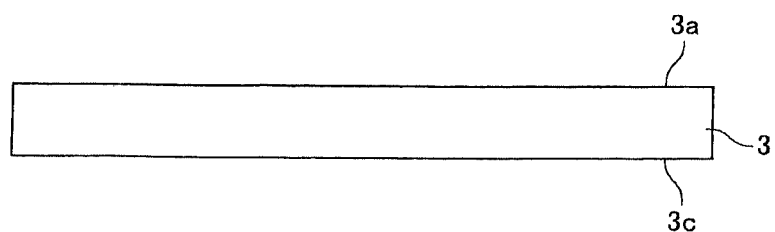
FIG. 3(a) shows a piezoelectric material substrate.

Further, as shown in FIG. 3(a), a piezoelectric material substrate 3 has a main surface 3a. Plasma is then irradiated onto the main surface of the piezoelectric material substrate 3, shown as arrows C, to activate the surface to form a surface-activated bonding surface 3b.

Figure 4A:
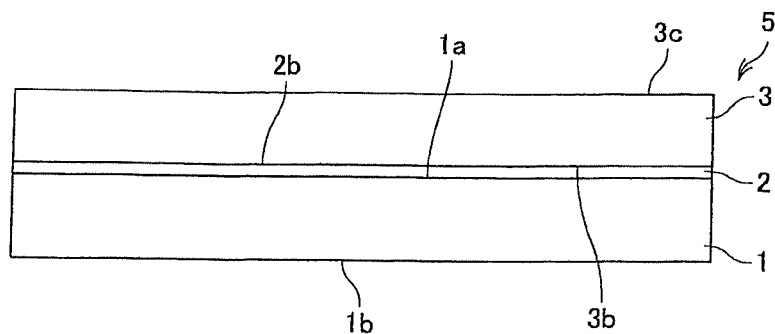
FIG. 4(a) shows a bonded body of the supporting substrate and piezoelectric material substrate.

The activated bonding surface 2b of the bonding layer 2 on the supporting substrate and the activated bonding surface 3b of the piezoelectric material substrate 3 are contacted with each other and subjected to direct bonding, to obtain a bonded body 5 shown in FIG. 4(a).

Figure 4B:
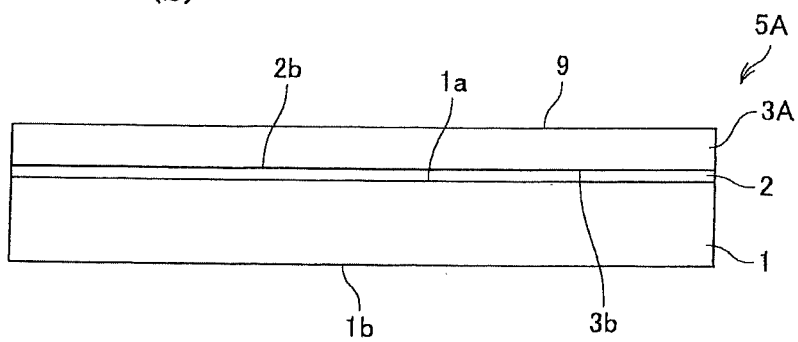
FIG. 4(b) shows the state that a piezoelectric material substrate of a bonded body is thinned by the processing.
Figure 4C:
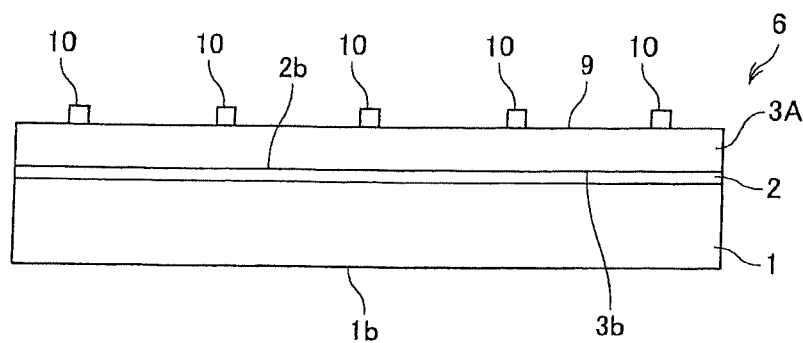
FIG. 4(c) shows an acoustic wave device.

At this stage, electrodes may be provided on the piezoelectric material substrate 3. However, preferably, as shown in FIG. 4(b), the main surface 3c of the piezoelectric material substrate 3 is processed to thin the substrate 3 to form a thinned piezoelectric material substrate 3A so that a bonded body 5A is provided. 9 represents a processed surface. Then, as shown in FIG. 4(c), predetermined electrodes 10 may be formed on the processed surface 9 of the piezoelectric material substrate 3A of the bonded body 5A to obtain an acoustic wave device 6.

Further, an intermediate layer may be provided between the bonding layer 2 and piezoelectric material substrate 3. FIGS. 5 and 6 relate to this embodiment.

According to the present embodiment, as shown in FIG. 2(a), a supporting substrate 1 having a pair of main surfaces 1a and 1b is prepared. Processing A is then performed on the main surface (bonding surface) 1a for roughening. Then, as shown in FIG. 2(b), a bonding layer 2 is film-formed on the main surface 1a of the supporting substrate 1. The surface of the bonding layer 2 is subjected to CMP polishing for obtaining a mirror surface. Then, as shown in FIG. 2(c), plasma is irradiated onto the bonding surface of the bonding layer 2, shown as arrows B, to obtain a surface-activated bonding surface 2b.

Figure 5A:
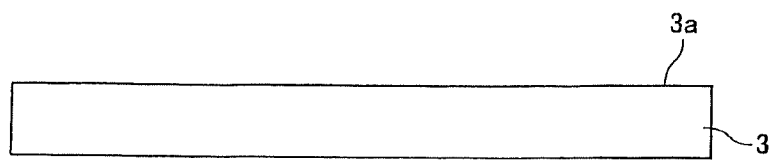
FIG. 5(a) shows the piezoelectric material substrate.
Figure 5B:
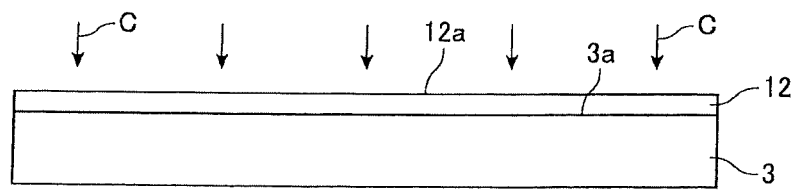
FIG. 5(b) shows the state that a bonding surface of an intermediate layer on the piezoelectric material substrate is activated.

Further, as shown in FIG. 5(a), a piezoelectric material substrate 3 having a main surface 3a is prepared. Then, as shown in FIG. 5(b), an intermediate layer 12 is formed on the main surface (bonding surface) 3a of the piezoelectric material substrate 3, and plasma is irradiated onto the surface of the intermediate layer 12, shown as arrows C, to perform the surface activation to form a surface-activated bonding surface 12a.

Figure 6A:
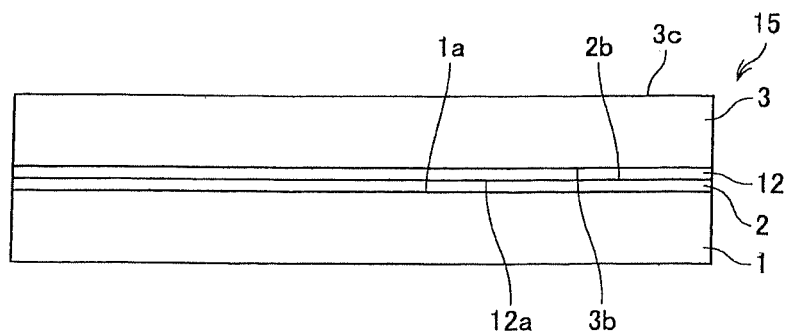
FIG. 6(a) shows a bonded body of the supporting substrate and piezoelectric material substrate.

Then, the activated surface 2b of the bonding layer 2 on the supporting substrate and the activated bonding surface 12a of the intermediate layer 12 on the piezoelectric material substrate 3 are contacted with and directly bonded with each other, to obtain a bonded body 15 shown in FIG. 6(a).

Figure 6B:
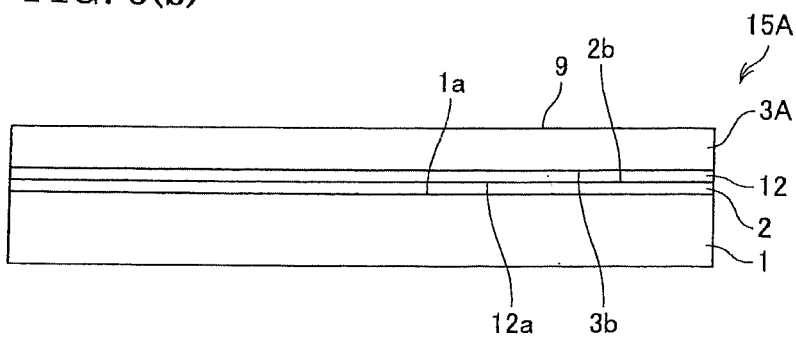
FIG. 6(b) shows the state that the piezoelectric material substrate of a bonded body is thinned by the processing.
Figure 6C:
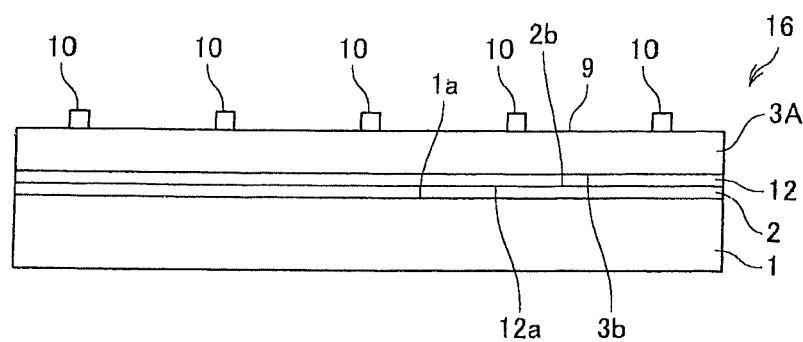
FIG. 6(c) shows an acoustic wave device.

At this stage, electrodes may be provided on the piezoelectric material substrate 3. However, preferably, as shown in FIG. 6(b), the main surface 3c of the piezoelectric material substrate 3 is processed to thin the substrate 3 to form a thinned piezoelectric material substrate 3A so that a bonded body 15A is provided. 9 represents a processed surface. Then, as shown in FIG. 6(c), predetermined electrodes 10 may be formed on the processed surface 9 of the piezoelectric material substrate 3A of the bonded body 15A to obtain an acoustic wave device 16.

Alternatively, after the bonding layer 2 is film-formed, the intermediate layer 12 may be subsequently film-formed on the bonding layer 2. In this case, CMP processing is performed on the surface of the intermediate layer 12 to obtain a bonding surface (mirror surface). Plasma is irradiated onto the thus obtained bonding surface to activate the surface. The surface of the supporting substrate is then subjected to plasma activation and directly bonded with the bonding surface of the intermediate layer.

According to the present embodiment, in the visual light range (range between a wavelength from 400 nm and 760 nm), provided that Δ is assigned to the difference of the phases of the p-polarized light and s-polarized light of the reflected light, the difference of the maximum and minimum values of the wavelength difference Δ is 70° or smaller. The points will be further described below.

Spectral ellipsometry is an analyzing method of measuring change of the polarized state of an incident light onto and that of the reflected light from a surface of a sample. As shown in FIG. 1, the incident plane is defined as a plane which is perpendicular to the surface of the supporting substrate or piezoelectric material substrate and includes the incident light and reflected light. The p-polarized light is defined as a polarized component whose electric field vibrates in parallel with the incident plane, and the s-polarized light is defined as a component whose electric field vibrates perpendicular to the incident plane. Here, the incident light is defined as a linearly polarized light in which the amplitudes and phases of the p-polarized light and s-polarized light (circular polarized light) are matched with each other. As the incident light is irradiated onto the substrate surface, the light reflected at the substrate surface and the light reflected at interfaces of layers or defects inside the substrate interfere with each other. Further, as the velocity of the light propagating the substrate is lower in response to the refractive index in the corresponding part, the phase is shifted at the same time. As these are different in the component (p-polarized light) in parallel with the incident plane and the component (s-polarized light) perpendicular to the incident plane, as shown in FIG. 1, the polarized state of the reflected light becomes elliptical polarized light, which is different from that of the incident light.

Here, the change of the polarized state is represented as Fresnel Amplitude Reflection Coefficient Ratio ρ.

$$\rho = r_p/r_s \quad (1)$$

Here, $r_p$ represents the Fresnel Amplitude Reflection Coefficient Ratio (ratio of electric field vectors of the incident light and reflected light) with respect to the p-polarized light, and $r_s$ represents the Fresnel Amplitude Reflection Coefficient Ratio with respect to the s-polarized light.

$$r_p = =E_{rp}/E_{ip} \quad (2)$$

$$r_s = =E_{rs}/E_{is} \quad (3)$$

As shown in FIG. 1, $E_{ip}$ represents the p-polarized component of the incident light, and $E_{is}$ represents the s-polarized component of the incident light. Further, $E_{rp}$ represents the p-polarized component of the emitted light and $E_{rs}$ represents the s-polarized component of the emitted light. $N_0$ and $N_1$ represent refractive indices of atmosphere and substrate.

The amplitude reflection coefficient is a complex number and indicates the changes of the amplitude and phase. Thus, the Fresnel Amplitude Reflection Coefficient ρ is defined by the following formula (4).

$$\rho = \tan \Psi \times e^{i\Delta} \quad (4)$$

Here, tan Ψ represents a ratio of the amplitudes of the p-polarized light and s-polarized light of the reflected light (refer to the formula (5)), and Δ represents the difference of the phases of the p-polarized light and s-polarized light of the reflected light (refer to formula (6)).

$$\tan \Psi = |r_p|/|r_s| \quad (5)$$

$$\Delta = \delta r_p - \delta r_s \quad (6)$$

Then, the present inventors particularly noted the difference Δ of the phases of the p-polarized light and s-polarized light of the reflected light (refer to the formula (6)) in the visual light range (range between a wavelength of 400 nm and 760 nm), measured Δ after subjecting the bonding surfaces of the piezoelectric material substrate and supporting substrate to various kinds of processes, and observed the relationship of this and the spurious wave. As a result, in the visual light range (wavelength range between 400 nm and 760 nm), it is found that the spurious wave can be considerably suppressed, with respect to the relative change (difference of the maximum and minimum values) of the phase difference Δ of the p-polarized light and s-polarized light of the reflected light. Specifically, the effect of suppressing the spurious wave is observed when the difference of the maximum and minimum values of the phase difference Δ is 70° or smaller.

Figure 7:
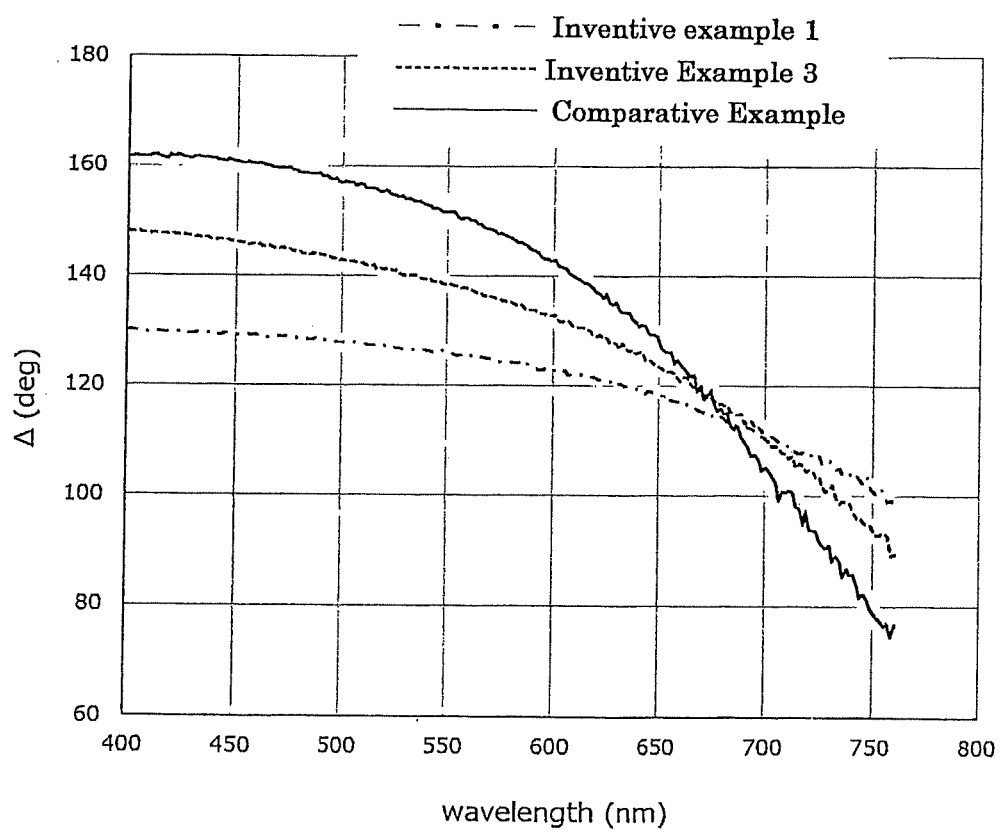
FIG. 7 is a chart showing the results of surface acoustic wave devices of the inventive and comparative examples by spectral ellipsometry.

Although the reason that such effects could be obtained is unclear, it is understood that optical rotation effect of the visual light is observed near the processed surface of the piezoelectric material substrate or supporting substrate to change the polarized state. Here, for example as shown in FIG. 7, the phase difference Δ generally tends to be larger in a short wavelength range and tends to be smaller in a long wavelength range. This means that the light of a shorter wavelength has larger light-rotation effect. Here, according to the inventive examples (inventive examples 1 and 3), the difference of the phase differences Δ on the sides of short wavelength and on the side of long wavelength is relatively small, so that the chart is smooth. Contrary to this, according to the comparative example, as the substrate surface is a mirror surface, the difference between the phase difference Δ on the side of short wavelength and the phase difference Δ on the side of long wavelength is large, so that the chart is steep. It is thought that the results reflect the change of microstructure of a surface denaturing layer near the processed surface.

In the wavelength range between 400 nm and 760 nm, the difference of the maximum and minimum values of the phase difference Δ of the p-polarized light and s-polarized light of the reflected light is preferably 70° or smaller, more preferably 65° or smaller and most preferably 60° or smaller. Further, in the wavelength range between 400 nm and 760 nm, the difference of the maximum and minimum values of the phase difference Δ of the p-polarized light and s-polarized light is preferably 20° or larger and more preferably 25° or larger.

It is preferred to apply the following processing method for controlling the measurement results by the spectral ellipsometry of the bonding surface of the piezoelectric material substrate or supporting substrate as described above.

As to the method for roughening the surfaces, a mechanical processing method such as a grinding process by grinding stones or blast processing by micro media such as alumina or silicon nitride, and ion beam processing of colliding ions at a high speed, may be used.

Respective constituents of the present invention will be described further in detail below.

Although the material of the supporting substrate 1 is not particularly limited, the material is preferably selected from the group consisting of silicon, quartz, sialon, mullite, sapphire and translucent alumina. It is thus possible to further improve the temperature characteristics on frequency of the acoustic wave device 6 or 16.

Although the film-forming method of the bonding layer or intermediate layer is not particularly limited, sputtering method, a chemical vapor deposition (CVD) method and a vapor deposition method may be used.

Although the material of the bonding layer 2 is not particularly limited as far as the surface activation process is possible, a metal oxide film is preferred, and the material may preferably be selected from the group consisting of silicon oxide, silicon nitride, aluminum nitride, alumina, tantalum pentoxide, mullite, niobium pentoxide and titanium oxide. Further, as the surface activation method, an appropriate method may be selected depending on the material used for the bonding layer. Such a surface activation method includes plasma activation and FAB (Ar atomic beam).

Although the material of the intermediate layer 12 is not particularly limited as far as the surface activation processing is possible, a metal oxide film is preferred, and a material selected from the group consisting of silicon oxide, silicon nitride, aluminum nitride, alumina, tantalum pentoxide, mullite, niobium pentoxide and titanium oxide is particularly preferred. Further, it is preferred to select the material of the intermediate layer to be different from that of the bonding layer.

The thickness of the bonding layer 2 is preferably 0.05 μm or larger, more preferably 0.1 μm or larger and most preferably 0.2 μm or larger. Further, the thickness of the bonding layer 2 is preferably 3 μm or smaller, more preferably 2 μm or smaller and further preferably 1 μm or smaller.

The piezoelectric material substrate 3 used in the present invention is composed of lithium tantalate (LT) single crystal, lithium niobate (LN) single crystal, or lithium niobate-lithium tantalate solid solution. As the materials have high propagation speed of an acoustic wave and large electromechanical coupling factor, they are suitable for a surface acoustic wave device of a high frequency and wide-band frequency application.

Further, although the normal line direction of the main surface 3a of the piezoelectric material substrate 3 is not particularly limited, for example, in the case that the piezoelectric material substrate 3 is made of LT, it is preferred to use the substrate rotated from Y-axis toward Z-axis by 32 to 55° ((180°, 58 to 35°, 180°) on Euler angle representation) around X-axis, which is a direction of propagation of a surface acoustic wave, because of a low propagation loss. In the case that the piezoelectric material substrate 3 is made of LN, (i) it is preferred to use the substrate rotated from Z axis toward −Y-axis by 37.8° ((0°, 37.8°, 0°) on Euler angle representation) around X-axis, which is the direction of propagation of the surface acoustic wave, because of a larger electromechanical coupling factor. Alternatively, (ii) it is preferred to use the substrate rotated from Y axis toward Z axis by 40 to 65° ((180°, 50 to 25°, 180°) on Euler angle representation) around X-axis, which is the direction of propagation of the surface acoustic wave, because of a high sound velocity. Further, although the size of the piezoelectric material substrate 3 is not particularly limited, for example, the diameter may be 100 to 200 mm and thickness may be 0.15 to 1 μm.

Plasma is then irradiated onto the bonding surfaces of the bonding layer 2 on the supporting substrate 1, of the piezoelectric material substrate 3 and of the intermediate layer 12 on the piezoelectric material substrate 3 at a temperature of 150° C. or lower, to activate the bonding surfaces. Although it is preferred to irradiate nitrogen plasma, it is possible to obtain the inventive bonded body even when oxygen plasma is irradiated.

The pressure during the surface activation is preferably 100 Pa or lower and more preferably 80 Pa or lower. Further, the atmosphere may be composed of nitrogen only, oxygen only or mixture of nitrogen and oxygen.

The temperature during plasma irradiation is preferably 150° C. or lower. It is thus possible to obtain a bonded body having a high bonding strength without deterioration of crystallinity. The temperature during the plasma irradiation is preferably 150° C. or lower, and more preferably 100° C. or lower.

Further, the energy of the plasma irradiation is preferably 30 to 150 W. Further, the product of the energy and irradiation time duration of the irradiated plasma is preferably 0.12 to 1.0 Wh.

The plasma-treated bonding surfaces of the piezoelectric material substrate and bonding layer are contacted with each other at room temperature. The treatment may be performed in vacuum and the contact may be performed in atmosphere.

When the activation of the surfaces is performed using an argon atomic beam, it is preferred to use a system described in Japanese patent publication No. 2014-086400A to generate the argon atomic beam, which is irradiated. That is, a high-speed atomic beam source of saddle field type is used as the beam source. Then, inert gas is introduced into the chamber and a high voltage is applied onto electrodes from a direct current electricity source. By this, an electric field of saddle field type generated between the electrode (positive electrode) and a housing (negative electrode) causes motion of electrons, e, so that argon atomic and ion beams are generated. Among the beams reached at a grid, the ion beam is neutralized at the grid, and the beam of argon atoms is emitted from the high-speed atomic beam source. In the activation step by beam irradiation, the voltage is preferably 0.5 to 2.0 kV, and the current is preferably 50 to 200 mA.

According to a preferred embodiment, before the surface activation treatment, the bonding surfaces of the bonding layer on the supporting substrate, of the piezoelectric material substrate and of the intermediate layer on the piezoelectric material substrate, are subjected to a flattening process. The method of flattening the respective surfaces includes lapping, chemical mechanical polishing (CMP) and the like. Further, the flattened surfaces may preferably have an Ra of 1 nm or lower and more preferably 0.3 nm or lower.

Then, the bonding surface of the bonding layer on the supporting substrate and the bonding surface of the piezoelectric material substrate 3 or bonding surface of the intermediate layer are contacted and bonded with each other. Thereafter, it is preferred to improve the bonding strength by performing annealing treatment. The temperature for the annealing treatment is preferably 100° C. or higher and 300° C. or lower.

The bonded bodies 5, 5A, 15 and 15A of the present invention can be appropriately used for the acoustic wave devices 6 and 16. That is, an acoustic wave device having the bonded body of the present invention and an electrode provided on the piezoelectric material substrate be provided.

Specifically, as the acoustic wave devices 6 and 16, a surface acoustic wave device, Lamb wave-type device, thin film resonator (FBAR) and the like are known. For example, the surface acoustic wave device is produced by providing input side IDT (Interdigital transducer) electrodes (also referred to as comb electrodes or interdigitated electrodes) for oscillating surface acoustic wave and IDT electrodes on the output side for receiving the surface acoustic wave on the surface of the piezoelectric single crystal substrate. By applying a high frequency signal on the IDT electrodes on the input side, an electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

The material forming the electrodes 10 on the piezoelectric material substrate 3A is preferably aluminum, aluminum alloy, copper or gold and more preferably aluminum or aluminum alloy. The aluminum alloy used is preferably Al doped with 0.3 to 5 weight percent of Cu. In this case, Ti, Mg, Ni, Mo, or Ta may be used instead of Cu.

EXAMPLES

Inventive Example 1

Figure 3B:
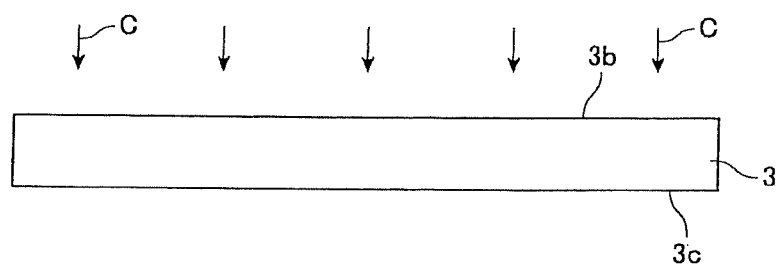
FIG. 3(b) shows the state that a bonding surface of the piezoelectric material substrate is activated.

An acoustic wave device 6 shown in FIG. 4(c) was produced, according to the method described referring to FIGS. 2 to 4.

Specifically, one main surface 3c of a 42Y-cut X-propagation $LiTaO_3$ substrate (piezoelectric material substrate) 3 having a thickness of 250 μm was polished into mirror surface and the other main surface 3a was subjected to lapping with GC #1000. Further, a Si(100) substrate (supporting substrate) 1 having a thickness of 0.23 mm and high resistance (>2 kΩ·cm) was prepared. The sizes of the respective substrates were 150 mm.

The bonding surface of the supporting substrate was then subjected to processing into a roughened surface. According to the present example, a grinding process using grinding stones of number of #6000 was performed. The amount of the processing was about 3 μm.

As the bonding surface of the supporting substrate was measured by spectral ellipsometry, provided that Δ is assigned to the difference of the phases of p-polarized light and s-polarized light of the reflected light, the difference of the maximum and minimum values of the phase difference Δ in a wavelength range of 400 nm to 760 nm was 31.3°.

A silicon oxide film 2 was film-formed to 0.7 μm on the bonding surface 1a of the supporting substrate 1, and the surface was polished by CMP (chemical mechanical polishing) to about 0.2 um for the flattening. Then, the bonding surface 3b of the piezoelectric material substrate 3 and bonding surface of the silicon oxide film 2 were activated by $N_2$ plasma, respectively, and then bonded with each other in atmosphere. Specifically, as the surface roughness of the bonding layer after the polishing was measured by AFM (Atomic force Microscope), it was confirmed that a mirror surface having an Ra of 0.4 nm could be obtained sufficient for the bonding.

Then, the bonding surface 3b of the piezoelectric material substrate 3 and bonding surface 2b of the bonding layer 2 were subjected to cleaning and surface activation. Specifically, ultrasonic cleaning by pure water was performed and the substrate surface was dried by spin drying. Then, the supporting substrate after the cleaning was introduced into a plasma activation chamber and the bonding surface of the bonding layer was activated at 30° C. by nitrogen gas plasma. The piezoelectric material substrate 3 was similarly introduced in the plasma activation chamber and subjected to surface activation by nitrogen plasma at 30° C. The time period of the surface activation was 40 seconds, and the energy was 100 W. The ultrasonic cleaning and spin drying were performed again as described above, for removing particles adhered during the surface activation.

The positions of the respective substrates were then adjusted so that the activated bonding surfaces of the respective substrates were contacted with each other at room temperature. The piezoelectric material substrate 3 was positioned on the upper side when the substrates were contacted. As a result, it was observed that the state (so-called bonding wave) at which the adhesion of the substrates was spreading proved that good preliminary bonding was accomplished. The bonded body was then charged into an oven filled with nitrogen atmosphere and held at 130° C. for 40 hours, for improving the bonding strength.

The surface 3c of the piezoelectric material substrate 3 of the bonded body, after the heating, was subjected to grinding, lapping and CMP processing so that the thickness of the piezoelectric material substrate 3A reached 7 μm.

Then, for confirming the effects of the present invention, a comb-shaped electrode made of aluminum metal was formed on the piezoelectric material substrate of the bonded body, to produce a resonator of a surface acoustic wave device. The specifications were as follows.

Figure 8:
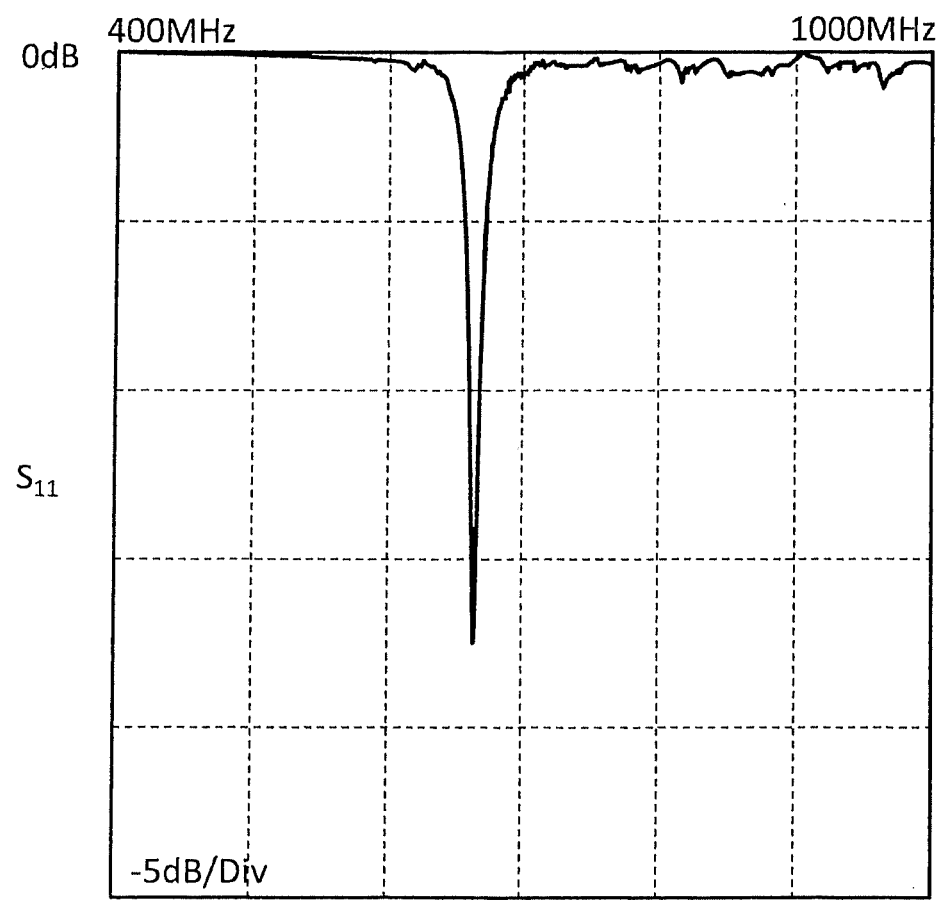
FIG. 8 is a chart showing reflection characteristics of the surface acoustic wave device of the inventive example.

IDT period: 6 μm
IDT opening length: 300 um
Number of IDT lines: 80 lines
Number of lines of reflector: 40 lines As the reflection characteristics of the resonator were measured by a network analyzer, spurious activity was hardly observed in a range higher than an anti-resonance frequency, as shown in FIG. 8. The value of the spurious wave was 2.7 dB.

The results are shown in Table 1.

Inventive Example 2

The resonator of the surface acoustic wave device was produced according to the same procedure as that for Inventive Example 1, and the reflection characteristics of the resonator were measured by the network analyzer. However, the processing of the bonding surface of the supporting substrate was performed by grinding the bonding surface by grinding stones of #8000.

Further, as the bonding surface of the supporting substrate was measured by spectral ellipsometry, provided that Δ is assigned to the difference of the phases of p-polarized light and s-polarized light of the reflected light, the difference of the maximum and minimum values of the phase difference Δ in a wavelength range of 400 nm to 760 nm was 37.4°. The amplitude of the spurious wave was 3.2 dB.

Inventive Example 3

The resonator of the surface acoustic wave device was produced according to the same procedure as Inventive Example 1, and the reflection characteristics of the resonator were measured by the network analyzer. However, the processing of the bonding layer of the supporting substrate was performed by blasting of the whole surface of the substrate with silicon nitride particles. The amount of processing was evaluated and was as small as 10 nm.

As the bonding surface of the supporting substrate was measured by spectral ellipsometry, provided that Δ is assigned to the difference of the phases of p-polarized light and s-polarized light of the reflected light, the difference of the maximum and minimum values of the phase difference Δ in a wavelength range of 400 nm to 760 nm was 58.5° in the wavelength range of 400 nm to 760 nm.

The amplitude of the spurious wave was 4.8 dB.

Inventive Example 4

The resonator of the surface acoustic wave device was produced according to the same procedure as that of Inventive Example 1, and the reflection characteristics of the resonator were measured by the network analyzer. However, the processing of the bonding surface of the supporting substrate was performed by charging the supporting substrate in an ion processing machine and by colliding Ar ions accelerated at 0.5 keV.

As the bonding surface of the supporting substrate was measured by spectral ellipsometry, provided that Δ is assigned to the difference of the phases of p-polarized light and s-polarized light of the reflected light, the difference of the maximum and minimum values of the phase difference Δ in a wavelength range of 400 nm to 760 nm was 42.8°.

As a result, the amplitude of the spurious wave was 3.3 dB.

Inventive Example 5

The resonator of the surface acoustic wave device was produced according to the same procedure as that of Inventive Example 1, and the reflection characteristics of the resonator were measured by the network analyzer. However, the processing of the bonding surface was performed by charging the supporting substrate in an ion processing machine and by colliding Ar ions accelerated at 1.0 keV.

Further, as the bonding surface of the supporting substrate was measured by spectral ellipsometry, provided that Δ is assigned to the difference of the phases of p-polarized light and s-polarized light of the reflected light, the difference of the maximum and minimum values of the phase difference Δ in a wavelength range of 400 nm to 760 nm was 50.9°.

The amplitude of the spurious wave was 3.5 dB.

Comparative Example 1

The resonator of the surface acoustic wave device was produced according to the same procedure as that of Inventive Example 1, and the reflection characteristics of the resonator were measured by the network analyzer. However, as the bonding surface of the supporting substrate was made a mirror surface, Ra was 0.02 nm.

As the bonding surface of the supporting substrate was measured by spectral ellipsometry, provided that Δ is assigned to the difference of the phases of p-polarized light and s-polarized light of the reflected light, the difference of the maximum and minimum values of the phase difference Δ in a wavelength range of 400 nm to 760 nm was 85.0°.

Figure 9:
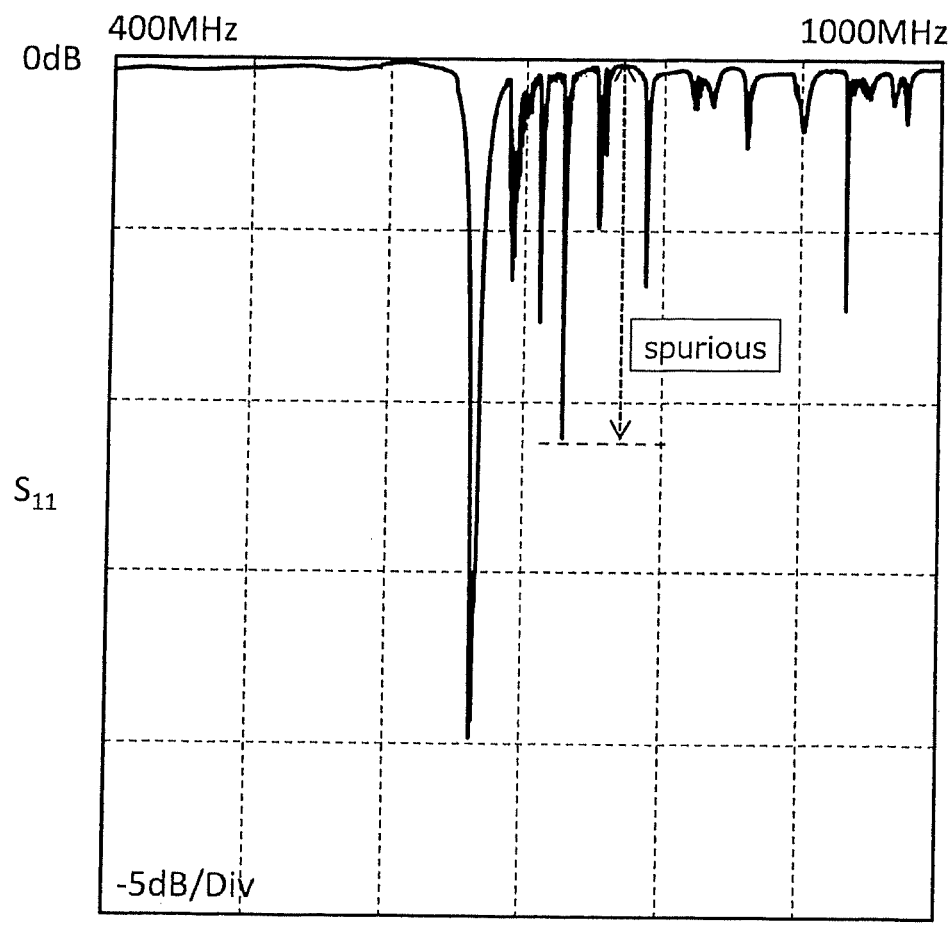
FIG. 9 is a chart showing reflection characteristics of the surface acoustic wave device of the comparative example.

Spurious activity was observed in the reflection characteristics, as shown in FIG. 9. The amplitude of the spurious wave was 12 dB.

TABLE 1

| | Difference of maximum and minimum values of Δ (°) | Spurious (dB) |
|---|---|---|
| Inventive Example 1 | 31.3 | 2.7 |
| Inventive Example 2 | 37.4 | 3.2 |
| Inventive Example 3 | 58.5 | 4.8 |
| Inventive Example 4 | 42.8 | 3.3 |
| Inventive Example 5 | 50.9 | 3.5 |
| Comparative Example | 85.0 | 12 |

The invention claimed is:

1. A bonded body comprising:
a supporting substrate;
a piezoelectric material substrate comprising a material selected from the group consisting of lithium niobate, lithium tantalate and lithium niobate-lithium tantalate;
a bonding layer bonding said supporting substrate and said piezoelectric material substrate,
wherein at least one of a bonding surface of said supporting substrate and a bonding surface of said piezoelectric material substrate has a difference of the maximum and minimum values of Δ of 70° or lower when the bonding surface is measured by spectral ellipsometry and Δ is assigned to a difference of phases of p-polarized light and s-polarized light of a reflected light in a wavelength range of 400 nm to 760 nm; and
a surface denatured region adjacent said at least one bonding surface, the surface denatured region disposed to being subjected to said spectral ellipsometry when Δ is measured.

2. The bonded body of claim 1, wherein said at least one bonding surface adjacent said surface denatured region has a roughened surface.

3. The bonded body of claim 1, wherein the bonded body has a spurious value of 4.8 dB or less.

4. The bonded body of claim 1, wherein said bonding layer comprises a material selected from the group consisting of silicon oxide, silicon nitride, aluminum nitride, alumina, tantalum pentoxide, mullite, niobium pentoxide and titanium oxide.

5. The bonded body of claim 1, wherein said difference Δ of said phases is 20° or higher.

6. The bonded body of claim 1, wherein said difference Δ of said phases is 65° or lower.

7. The bonded body of claim 1, wherein said difference Δ of said phases is 60° or lower and 25° or higher.

8. The bonded body of claim 1, wherein said bonding surface of said supporting substrate has a difference Δ of said phases of 70° or lower.

9. The bonded body of claim 1, wherein said supporting substrate comprises a material selected from the group consisting of silicon, quartz, sialon, mullite, sapphire and translucent alumina.

10. The bonded body of claim 1, wherein said supporting substrate comprises silicon.

11. The bonded body of claim 1, wherein said supporting substrate comprises said at least one bonding surface adjacent said surface denatured region.

12. The bonded body of claim 1, wherein said at least one bonding surface adjacent said surface denatured region is provided by grinding with grinding stones, by blast processing with micro media or by ion beam processing.

13. The bonded body of claim 12, wherein said at least one bonding surface adjacent said surface denatured region is provided by grinding with grinding stones, by blast processing with micro media or by ion beam processing of a mirror surface.

14. The bonded body of claim 12, wherein said at least one bonding surface adjacent said surface denatured region is provided by grinding with grinding stones of #6000 to #8000.

15. The bonded body of claim 12, wherein said at least one bonding surface adjacent said surface denatured region is provided by blast processing with micro media comprising alumina or silicon nitride.

16. The bonded body of claim 12, wherein said at least one bonding surface adjacent said surface denatured region is provided by ion beam processing with colliding Ar ions.

* * * * *